Jan. 4, 1966 R. W. BROUNLEY 3,227,968

FREQUENCY MODULATED CRYSTAL CONTROLLED OSCILLATOR

Filed Jan. 9, 1962 3 Sheets-Sheet 1

INVENTOR.
RICHARD W. BROUNLEY
BY
Hillman, Smith & Lamb
ATTORNEYS

Jan. 4, 1966 R. W. BROUNLEY 3,227,968

FREQUENCY MODULATED CRYSTAL CONTROLLED OSCILLATOR

Filed Jan. 9, 1962 3 Sheets-Sheet 2

INVENTOR.
RICHARD W. BROUNLEY
BY
Killman, Smith & Lamb
ATTORNEYS

INVENTOR.
RICHARD W. BROUNLEY
BY
Fillman, Smith & Lamb
ATTORNEYS

United States Patent Office 3,227,968

Patented Jan. 4, 1966

3,227,968
FREQUENCY MODULATED CRYSTAL CONTROLLED OSCILLATOR

Richard W. Brounley, Towson, Md., assignor to The Bendix Corporation, Towson, Md., a corporation of Delaware Filed Jan. 9, 1962, Ser. No. 165,094
4 Claims. (Cl. 332—26)

This invention relates to crystal controlled oscillators and more particularly to a transistor powered crystal controlled oscillator circuit including means for providing frequency deviation over a substantial frequency range.

Numerous schemes have been advanced for attempting to effect frequency modulation of crystal controlled transistor oscillator circuits. One such scheme involves the use of a stable oscillator circuit using fundamental crystals which can be varied in frequency over a comparatively small range. Other schemes have been proposed in which reactance means is used in combination with the crystal and in which the effective reactance across the combination can be made to vary with current flow through the control transistor which in turn varies the resonant frequency of the series combination of the capacitor and crystal and thereby varies the oscillation frequency of the oscillator. Such arrangements are dependent upon the characteristics of the transistors involving changes in internal capacitance etc., and are not always fully understood. Because of the dependence on these internal transistor characteristics, the frequency deviations permitted by such circuits typically are variable with different transistors used in the circuit. Similarly, such circuits tend to vary in output with temperature variations effecting the transistor. It is therefore an object of the present invention to provide an improved form of frequency modulated transistor oscillator circuit.

It is another object of the present invention to provide a frequency modulated transistor oscillator circuit having a crystal controlled center frequency in which sufficient frequency deviation is obtained to eliminate or minimize the need for using frequency multipliers after the oscillator circuit.

It is another object to provide a frequency modulated oscillator circuit meeting the above objectives and which has a high degree of frequency stability over the desired range.

It is another object of the present invention to provide a modulated oscillator circuit meeting the above objectives in which the amplitude modulation component is insignificant.

It is another object of the present invention to provide a frequency modulated transistor oscillator circuit operable over a substantial frequency band in which the resonant frequency is substantially independent of variations in the characteristics of the individual transistors used.

It is a further object of the present invention to provide a frequency modulated transistor oscillator circuit operable over a substantial frequency band in which the resonant frequency is substantially independent of temperature variations effecting its transistor.

It is a further object of the present invention to provide a frequency modulated transistor oscillator circuit operable over a substantial frequency band in which the input impedance is substantial, resulting in a much lower input audio power requirement than is usual with low impedance transistor circuits.

It is a further object of the present invention to provide a frequency modulated transistor oscillator circuit operable over a substantial frequency band which may be manufactured in a package of very small size and weight.

Other objects and advantages will become apparent from the following specification taken in conjunction with the accompanying drawings in which.

Figure 1:
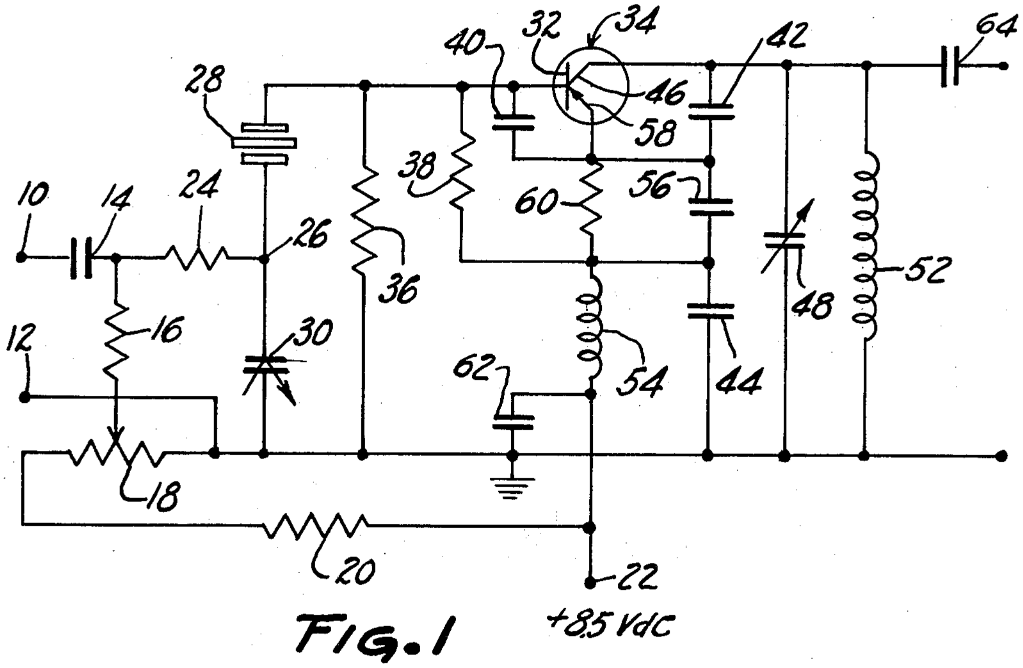
FIG. 1 is a schematic drawing of an oscillator circuit embodying my invention.

FIG. 1 shows the schematic of the oscillator which is essentially a modified Colpitts with the crystal, in series with a voltage variable semiconductor capacitor to ground, acting as a short circuit at the operating frequency. The audio input is supplied to a terminal 10 which may be part of a coaxial connector having a connection with a ground terminal 12. This input is supplied across a D.C. blocking capacitor 14 to a voltage dividing circuit consisting of a resistor 16, a potentiometer 18, and a resistor 20 connected to a source of direct current voltage at a terminal 22. A resistor 24 of comparatively high value acts as a current limiting resistor and contributes to the high impedance at the input of the oscillator circuit. Resistor 24 is connected to a terminal 26 positioned between a crystal 28 and a voltage variable semiconductor capacitor 30, said crystal and semiconductor capacitor being connected in series to the base 32 of the transistor 34. A pair of resistors 36 and 38 operate in a conventional manner to establish the bias on the base 32 of transistor 34. A capacitor 40 in the base-emitter circuit operates to swamp out input capacitance in the transistor thereby helping to make the oscillator circuit independent of variations in transistor parameters.

The tuned circuit of the oscillator consists of capacitors 42 and 44 connected between the collector 46 of transistor 34 and ground, a variable capacitor 48 connected across capacitors 42 and 44, and an inductor 52. Capacitor 44 acts as a tap on the resonant circuit developing a feedback voltage across an inductor 54 and this voltage is supplied across the capacitor 56 to the emitter 58 of the oscillator transistor 34 for the purpose of sustaining oscillations. A resistor 60 between the emitter 58 and the inductor 54 acts to establish the bias on the emitter in a well known manner. A capacitor 62 acts to keep undesired alternating current signals out of the power supply as supplied at terminal 22. The output of the oscillator circuit as modulated by the input supplied to the audio terminal 10 is supplied across a coupling capcitor 64 to the next stage.

Since the crystal 28 and the semiconductor capacitor 30 series combination is within the feedback loop, oscillations can only occur at frequencies in the vicinity of series resonance of the two. At any other frequency the combination represents a high impedance in the base circuit preventing feedback power from being delivered to the input of the transistor. This condition makes the frequency of operation practically independent of any parameters, excepting that of the semiconductor capacitor 30 and the crystal 28. In addition, the small capacity of the semiconductor capacitor 30 effectively isolates any other impedances appearing across the crystal 28. This is particularly advantageous in transistor oscillators because of the variation in transistor parameters with voltage, current, temperature, etc. The oscillator tunes in a conventional manner, the power output increasing as the collector variable capacitor 48 is tuned to increasing capacitance and then falling off suddenly after the maximum power is reached. Because of the sharp feedback control in the base circuit, the frequency changes only slightly during this procedure.

Figure 2:
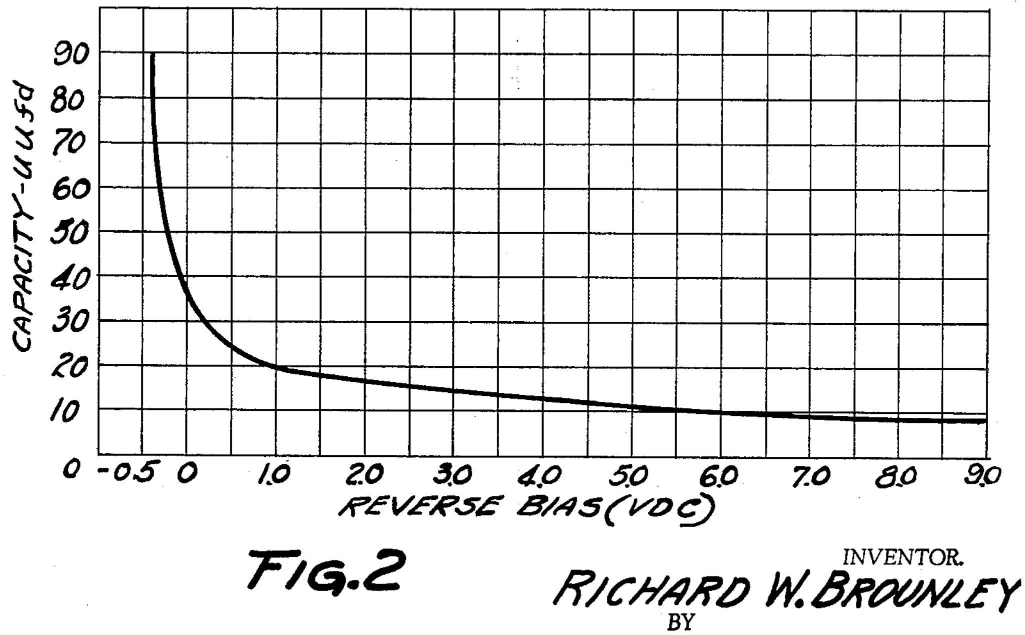
FIG. 2 is a graph showing the capacity versus voltage characteristics of a typical voltage variable semiconductor capacitor.

As explained above, the combination of the crystal 28 and the voltage variable semiconductor capacitor 30 controls the operating frequency. Frequency modulation is obtained by superimposing the audio signal from terminal 10 on the bias supply for the capacitor 30. FIG. 2 is a graph showing the manner in which capacity of the semiconductor capacitor 30 varies with changes in bias voltage. It will be observed that this curve shows that the capacitance is inversely proportional to the square root of the bias voltage.

Figure 3:
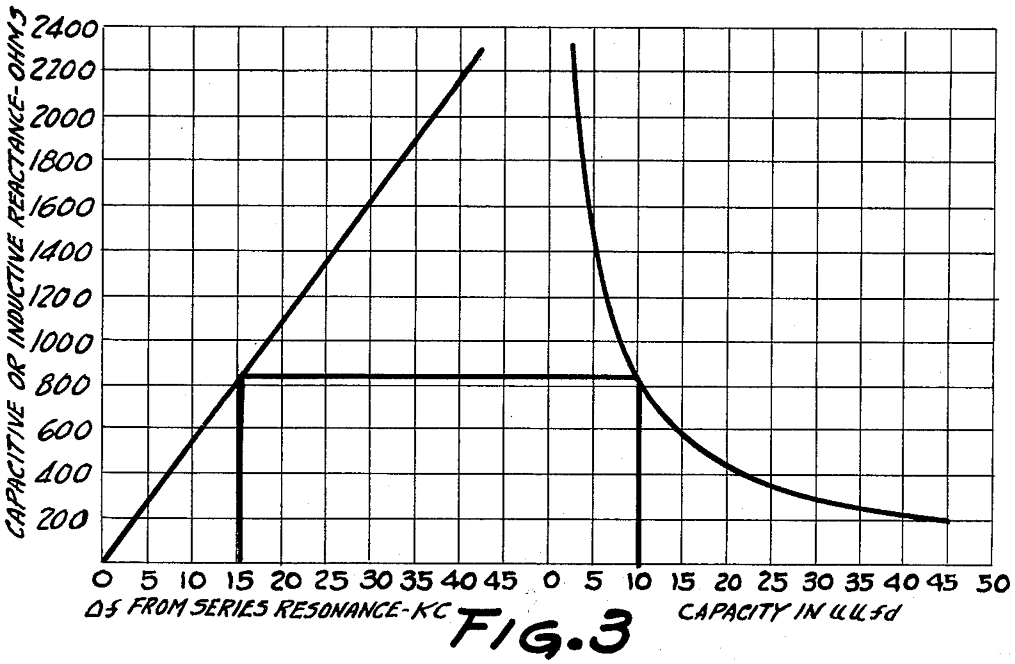
FIG. 3 is a graph comparing inductive reactance of the crystal used in such a circuit above series resonance with the total capacitive reactance across the crystal necessary for oscillation.

FIG. 3 is a graph showing the relationship between crystal inductive reactance and changes in frequency ($\Delta f$) from series resonance for a typical crystal used in this circuit. Also on this same graph is a plot of capacitive reactance versus capacity. For any given total capacity across the crystal, the crystal must present an equal inductance reactance. For instance if the variable capacitor 30 is adjusted to give a total of 10 $\mu\mu$f. across the crystal, the crystal would operate at 16 kc. above its series resonant point.

Figure 4:
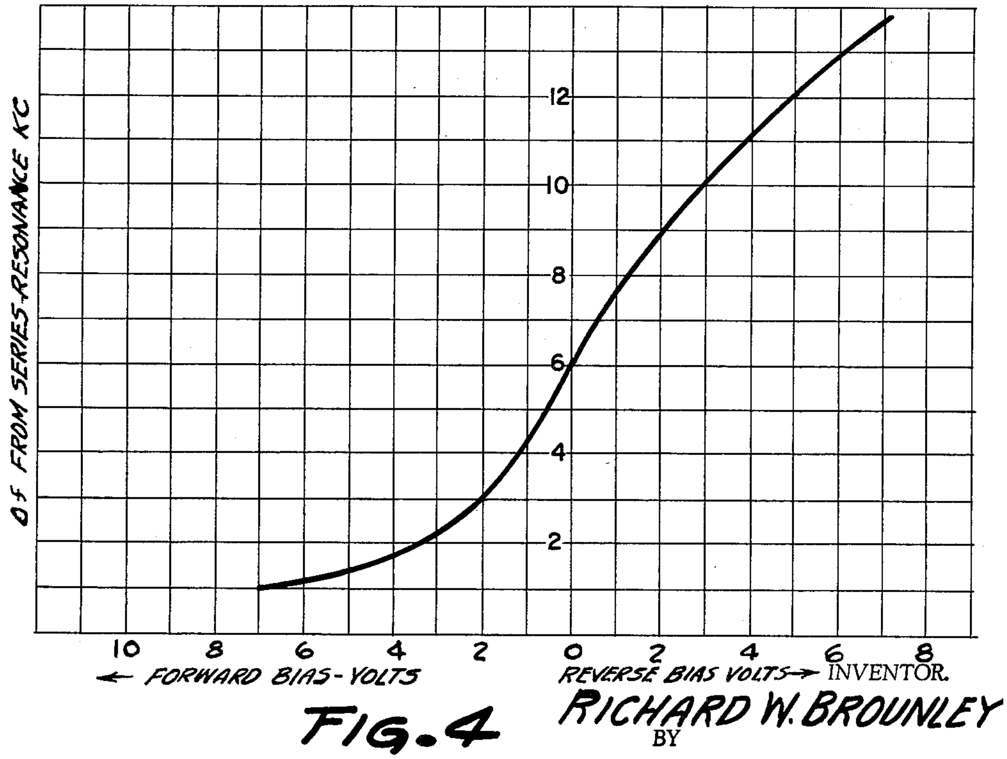
FIG. 4 is a graph showing oscillator deviation from series resonance with variations in the supply voltage to the voltage variable semiconductor capacitor.

A unique feature of the circuit is the manner in which the two capacity curves of the FIGS. 2 and 3 tend to linearize the modulation characteristics of the oscillator. FIG. 3 shows that as the capacity across the crystal decreases a greater change in frequency results for a given change of capacity. This characteristic is fortunate since the voltage variable capacitor has less change in capacity in the bias range where the capacity is small. By comparing the two curves in FIGS. 2 and 3 it will be seen that the reverse condition occurs toward the low frequency end of the curve. FIG. 4 shows the results of applying a D.C. bias voltage to the voltage variable capacitor, as shown in FIG. 1, and measuring the change in frequency above series resonance with a change in bias. By selecting a bias voltage, the modulation characteristics about this point can be determined. With a reverse bias voltage of +.5 volts D.C. the crystal oscillator was pulled plus or minus 5 kc. with less than 5 percent distortion. The bias voltage shown in FIG. 4 is not the voltage directly across the voltage variable capacitor 30 except in the reverse bias case above approximately 1 volt. This voltage is applied through the current limiting resistor 24 and in the forward bias case the actual voltage across the voltage variable capacitor 30 follows the voltage versus current relationship of the capacitor 30, the remainder being across current limiting resistor 24. In addition, there is a small amount of self bias developed from the oscillator voltage. So far as modulation is concerned, FIG. 4 represents the characteristics used during modulation and can be used directly for this purpose.

The stability of the crystal being fixed by the manufacturer, the circuit stability is primarily dependent upon the voltage variable capacitor and it is therefore necessary to take into consideration its characteristics. This circuit requires a stable bias voltage. The temperature coefficient of the voltage variable capacitor used in this example is zero at a reverse bias voltage at 16 volts and increases as this voltage is decreased. From this consideration the maximum bias should be used for the degree of deviation required. As an example, at a bias voltage of +.5 volts D.C. the maximum deviation is plus or minus 5 kc. and the overall frequency stability including plus or minus .002 percent for the crystal is about plus or minus .005 percent. At a bias voltage of 2 volts D.C. the maximum deviation is plus or minus 2 kc. and the stability is plus or minus .003 percent.

In order to maintain consistency in modulation characteristics, it is necessary to specify certain parameters of the crystal for the manufacturer. Below are necessary relationships to be used for this purpose.

(1) $$S_a = f_s / 2\mu$$

(2) $$r = C_{ox} / C_1$$

$S_a$=pole spacing
$f_s$=series resonant frequency
$r$=mechanical coupling factor
$C_{ox}$=terminal capacity of crystal
$C_1$=series arm capacity of crystal.

It can be seen from FIG. 3 that for a given value of external capacity, the sum of the varicap capacity and $C_{ox}$, the frequency above series resonance where the crystal inductive reactance is equal to the external capacity, is dependent on $S_a$. Also the frequency deviation is directly proportional to the pole spacing.

This oscillator is presently being used in an application in which the crystal frequency is multiplied by a factor of eight times. If the crystals are purchased by specifying $C_{ox}$, $f_s$ and $S_a$ constant, then the crystal will have constant modulation characteristics and will operate at the same $\Delta f$ from $f_s$ over the band, when working into a constant external capacity. This would mean changing $r$ accordingly. If the crystals are purchased by specifying $C_{ox}$, $f_s$ and $r$ constant then $S_a$ will vary over the band, the crystal will have to operate with a changing $\Delta f$ and above $f_s$ and the modulation characteristics will change. For the first condition, since the pole spacing is held constant over the band, the high frequency end will have greater stability over the low end. The second condition, where $r$ is held constant over the band, the pole spacing remains a constant percentage of the operating frequency and no change in stability over the band will result. If the band of frequencies to be used is a large percentage the above considerations would have to be taken into account in order to arrive at the desired results.

A unique feature of the characteristics of the voltage variable capacitor may be used to advantage to decrease the distortion for large frequency deviations. Since the capacitive reactance of the voltage variable capacitor is directly proportional to the square root of its bias voltage it is only necessary to feed the modulating signal through a suitable square law device to make the capacitive reactance directly proportional to the applied voltage, thereby pulling the crystal linearally instead of only partially linearizing it with the square root function of the voltage variable capacitor. It is important to bias the square law device and to swing the modulating voltage about this point in such manner as to complement the varicap characteristics. It would be of no advantage to swing over a large portion of the square law device and over only a small portion of the characteristics of the voltage variable capacitor. The two curves must complement each other on an instantaneous basis. This principle has been applied to the above oscillator with very significant reductions in distortion by means of an input circuit similarly to that shown in FIG. 5. In this device the audio signal is supplied to an input jack at terminal 70 where it appears across a potentiometer 72. The slider on this potentiometer is selected to provide a voltage of the proper magnitude to the base 74 of a transistor 76 through a coupling capacitor 78, a diode 80, an additional potentiometer 82 and a coupling capacitor 84. Transistor 76 is suitably biased in a conventional manner by means of resistors 86, 88 and 90 and the capacitor 92 which bypasses resistor 90. The output from this square law amplifier appears at the collector 94 of transistor 76 and is developed across an output resistor 96 from whence it is supplied to the terminal 10 on the FIG. 1 device. Power for this circuit is supplied from a terminal 98 connected to a low voltage D.C. source having connections with a potentiometer 100 providing means for varying this voltage level and including a current limiting resistor 102.

Figure 5:
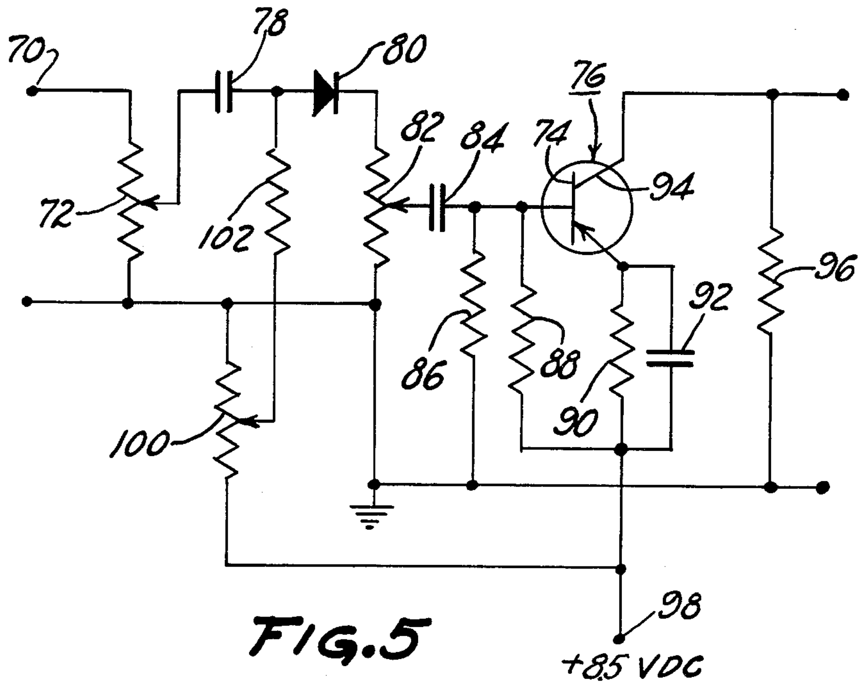
FIG. 5 is a schematic drawing of a typical input circuit which has a square law characteristic capable of compensating for the non-linear voltage versus capacity characteristic of the voltage variable semiconductor capacitor.
Figure 6:
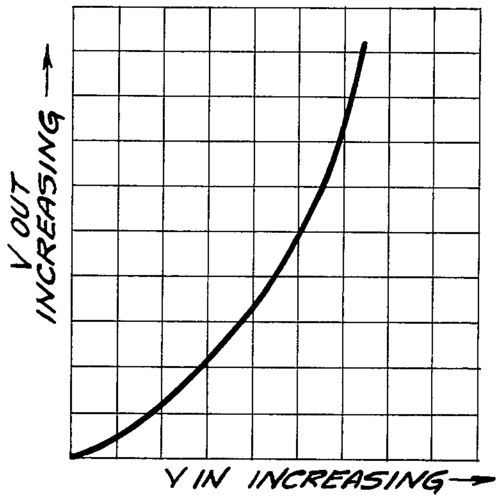
FIG. 6 is a graph showing the manner in which the output voltage of the circuit of FIG. 5 varies with changes in input.

The output characteristics of the device of FIG. 5 are shown on the graph of FIG. 6 wherein input volts $V_{in}$ is plotted versus output voltage $V_{out}$ and it will be observed that the characteristic is a second order curve.

The oscillator described herein yields no amplitude modulation when modulated because the feedback ratio is not changed by the applied signal. Instead, the effective short circuit from base to ground is merely moved to the new frequency. In addition the voltage variable capacitor offers a high impedance load to the driving source thereby requiring only a small amount of driving power.

Although only one embodiment is shown and described herein it is recognized that modifications will become apparent to those skilled in the art which may be effected without departing from the spirit and scope of the invention.

What is claimed is:

1. A frequency modulated crystal controlled oscillator circuit including in combination:
a resonant circuit;
a transistor including a control electrode;
a source of direct current power and means connecting said source to said transistor;
means connecting said control electrode with said resonant circuit, said means including a piezoelectric crystal and a voltage variable semiconductor capacitor connected in series;
means having connections with said power source for biasing said semiconductor capacitor;
and input terminals for receiving a modulating input signal effectively connected across said semiconductor capacitor.

2. A frequency modulate crystal controlled oscillator circuit comprising:
a transistor having base, emitter and collector electrodes;
a tuned circuit connected in the collector circuit of said transistor, said tuned circuit including a reactive tap;
a source of direct current power and means connecting said source to said emitter;
means connecting the output of said reactive tap to the circuits of said base and emitter electrodes to provide feedback from said tuned circuit to sustain oscillations;
a piezoelectric crystal and a voltage variable semiconductor capacitor forming a series resonant circuit connected in said base circuit;
means connected to said power source effective to bias said semiconductor capacitor; and
means effectively connecting a modulating input signal across said semiconductor capacitor.

3. A frequency modulated oscillator circuit including, in combination:
a resonant load circuit;
a transistor having an output and a control electrode, said output electrode being connected to said load circuit;
feedback means applying a portion of the output of said load circuit to said transistor to sustain oscillations;
a direct current power supply connected to said transistor;
a series resonant circuit connected to said control electrode of said transistor, said circuit including a piezoelectric crystal and a voltage variable semiconductor capacitor connected in series;
an input circuit to which a modulating input signal is applied, said input circuit including a direct current blocking capacitor and a current limiting resistor for applying said input signal across said semiconductor capacitor; and
a biasing circuit including a resistor connected between said power supply and said semiconductor capacitor for reverse biasing said capacitor.

4. A frequency modulated crystal controlled oscillator circuit comprising:
a transistor having base, emitter, and collector electrodes;
a tuned circuit connected in the collector circuit of said transistor, said tuned circuit including a capacitive tap and a variable capacitor;
a source of direct current power and means including an inductor and a first biasing resistor connecting said source to said emitter;
means connecting the output of said capacitor tap to said emitter;
a series resonant circuit connected in the base circuit of said transistor, said series resonant circuit including a piezoelectric crystal and a voltage variable semiconductor capacitor;
an input circuit for receiving an audio frequency input signal and applying said input signal effectively across said semiconductor capacitor, said input circuit including a direct connection to one side of said semiconductor capacitor and a connection including a coupling capacitor and a second current limiting resistor to the other side of said semiconductor capacitor;
and a voltage dividing network including a third resistor and a potentiometer having one end connected to said direct connection of said input circuit, the other end connected to said source of direct current power, and the slider terminal connected through said third resistor to the point of connection of said coupling capacitor to said second limiting resistor.

References Cited by the Examiner

UNITED STATES PATENTS 2,925,561 2/1960 MacDonald ---------- 332—30
3,046,496 7/1962 Trevor -------------- 332—19

ROY LAKE, *Primary Examiner.*

JOHN KOMINSKI, *Examiner.*